(12) United States Patent
Cho et al.

(10) Patent No.: US 11,948,826 B2
(45) Date of Patent: Apr. 2, 2024

(54) HIGH POWER ELECTROSTATIC CHUCK DESIGN WITH RADIO FREQUENCY COUPLING

(71) Applicant: Applied Materials, Inc., Santa Clara, CA (US)

(72) Inventors: Jaeyong Cho, San Jose, CA (US); Vijay D. Parkhe, San Jose, CA (US); Haitao Wang, Fremont, CA (US); Kartik Ramaswamy, San Jose, CA (US); Chunlei Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/985,764

(22) Filed: Nov. 11, 2022

(65) Prior Publication Data

US 2023/0072594 A1 Mar. 9, 2023

Related U.S. Application Data

(62) Division of application No. 15/383,035, filed on Dec. 19, 2016, now Pat. No. 11,532,497.

(Continued)

(51) Int. Cl.
*H01L 21/683* (2006.01)
*C23C 16/458* (2006.01)
(Continued)

(52) U.S. Cl.
CPC ...... *H01L 21/6833* (2013.01); *C23C 16/4586* (2013.01); *C23C 16/4587* (2013.01);
(Continued)

(58) Field of Classification Search
CPC .......... H01L 21/6833; H01L 21/32724; H01L 21/32697; C23C 16/4587; C23C 16/466; C23C 16/505; C23C 16/4586
(Continued)

(56) References Cited

U.S. PATENT DOCUMENTS 5,880,922 A 3/1999 Husain
5,880,923 A 3/1999 Hausmann
(Continued)

FOREIGN PATENT DOCUMENTS

JP 2004-095665 3/2004
JP 2005-033181 2/2005
(Continued)

OTHER PUBLICATIONS

International Search Report and Written Opinion for Application No. PCT/US2017/015183, dated May 2, 2017, 12 pgs.
(Continued)

*Primary Examiner* — Charlee J. C. Bennett
(74) *Attorney, Agent, or Firm* — Schwabe, Williamson & Wyatt, P.C.

(57) ABSTRACT

An electrostatic chuck is described that has radio frequency coupling suitable for use in high power plasma environments. In some examples, the chuck includes a base plate, a top plate, a first electrode in the top plate proximate the top surface of the top plate to electrostatically grip a workpiece, and a second electrode in the top plate spaced apart from the first electrode, the first and second electrodes being coupled to a power supply to electrostatically charge the first electrode.

14 Claims, 5 Drawing Sheets

Related U.S. Application Data

(60) Provisional application No. 62/352,667, filed on Jun. 21, 2016, provisional application No. 62/346,746, filed on Jun. 7, 2016.

(51) Int. Cl.
  *C23C 16/46* (2006.01)
  *C23C 16/505* (2006.01)
  *H01J 37/32* (2006.01)

(52) U.S. Cl.
  CPC .......... *C23C 16/466* (2013.01); *C23C 16/505* (2013.01); *H01J 37/32697* (2013.01); *H01J 37/32724* (2013.01)

(58) Field of Classification Search
  USPC ......... 118/715–733 W; 156/345.1–345.55 W, 156/345.37 W
  See application file for complete search history.

(56) References Cited

U.S. PATENT DOCUMENTS

| | | | |
|---|---|---|---|
| 5,986,874 A * | 11/1999 | Ross | H01L 21/6831 279/128 |
| 6,057,244 A * | 5/2000 | Hausmann | H01J 37/321 438/706 |
| 6,104,596 A * | 8/2000 | Hausmann | H01L 21/6833 279/128 |
| 6,267,839 B1 * | 7/2001 | Shamouilian | B23Q 3/154 156/345.51 |
| 6,478,924 B1 * | 11/2002 | Shamouilian | H01J 37/32706 |
| 6,483,690 B1 * | 11/2002 | Nakajima | H01L 21/6833 361/234 |
| 6,494,958 B1 * | 12/2002 | Shamouilian | C23C 16/4581 118/723 E |
| 6,793,767 B2 * | 9/2004 | Chu | H01L 21/6831 118/723 E |
| 8,303,834 B2 | 11/2012 | Honda et al. | |
| 2002/0009459 A1 | 7/2002 | Sill et al. | |
| 2002/0094591 A1 * | 7/2002 | Sill | H01J 37/321 438/14 |
| 2004/0040664 A1 | 3/2004 | Yang et al. | |
| 2005/0041364 A1 * | 2/2005 | Kellerman | H01L 21/6875 361/234 |
| 2007/0097603 A1 * | 5/2007 | Fujii | H01L 21/6831 361/600 |
| 2009/0002913 A1 * | 1/2009 | Naim | H01L 21/67109 361/234 |
| 2009/0040681 A1 * | 2/2009 | Fujisawa | H02N 13/00 361/234 |
| 2009/0314433 A1 * | 12/2009 | Hoffman | H01L 21/6833 156/345.48 |
| 2010/0018648 A1 * | 1/2010 | Collins | H01J 37/32082 156/345.24 |
| 2011/0092072 A1 * | 4/2011 | Singh | H01L 21/6833 438/710 |
| 2011/0096461 A1 | 4/2011 | Yoshikawa et al. | |
| 2012/0033340 A1 * | 2/2012 | Roy | H01L 21/67103 361/234 |
| 2012/0087058 A1 * | 4/2012 | Hansen | G03F 7/70783 361/234 |
| 2013/0003250 A1 | 1/2013 | Morimoto et al. | |
| 2013/0021717 A1 * | 1/2013 | Singh | H01L 21/6831 361/234 |
| 2013/0107415 A1 * | 5/2013 | Banna | H01L 21/6831 361/234 |
| 2013/0230974 A1 * | 9/2013 | Martinez | H01L 21/68771 438/464 |
| 2014/0231019 A1 * | 8/2014 | Kajihara | H01L 21/67103 156/345.51 |
| 2015/0181683 A1 * | 6/2015 | Singh | H01L 21/6833 361/234 |
| 2016/0111314 A1 * | 4/2016 | Kimball | H01J 37/32724 438/710 |
| 2017/0098564 A1 * | 4/2017 | Pape | G01K 1/026 |
| 2017/0110356 A1 * | 4/2017 | Matyushkin | H01L 21/68785 |
| 2017/0117174 A1 * | 4/2017 | Weichart | H01L 21/6831 |
| 2019/0088519 A1 * | 3/2019 | Cho | H01L 21/6833 |

FOREIGN PATENT DOCUMENTS

| | | |
|---|---|---|
| JP | 2011-108663 | 6/2013 |
| JP | 2016-051877 | 4/2016 |
| KR | 1020070045961 A | 5/2007 |
| KR | 1020120120400 A | 11/2012 |
| KR | 1020150058489 A | 5/2015 |
| KR | 1020160045614 A | 4/2016 |
| TW | 2013-44780 | 11/2013 |
| WO | 2016-009715 | 1/2016 |
| WO | WO 2015-111616 | 3/2017 |

OTHER PUBLICATIONS

International Preliminary Report on Patentability from PCT/US2017/015183 dated Dec. 20, 2018, 10 pgs.
Non-final Office Action from U.S. Appl. No. 15/383,035 dated Jul. 10, 2019, 22 pgs.
Final Office Action from U.S. Appl. No. 15/383,035 dated Jan. 17, 2020, 15 pgs.
Non-final Office Action from U.S. Appl. No. 15/383,035 dated May 14, 2020, 16 pgs.
Official Letter from Taiwan Patent Application No. 106103433 dated Aug. 11, 2020, 17 pgs.
Final Office Action from U.S. Appl. No. 15/282,035 dated Sep. 9, 2020, 17 pgs.
Notice of Reasons for Rejection from Japanese Patent Application No. 2017-558663 dated Feb. 10, 2021, 18 pgs.
Notice of Office Action from Taiwanese Patent Application No. 106103433 dated Mar. 9, 2021, 14 pgs.
Non-final Office Action from U.S. Appl. No. 15/383,035 dated Apr. 14, 2021, 25 pgs.
Second Office Action from Japanese Patent Application No. 2017-558663 dated Aug. 10, 2021, 13 pgs.
Final Office Action from U.S. Appl. No. 15/383,035 dated Sep. 20, 2021, 21 pgs.
Official Letter from Taiwan Patent Application No. 106103433 dated Oct. 7, 2021, 14 pgs.
Non-final Office Action from U.S. Appl. No. 15/383,035 dated Mar. 15, 2022, 23 pgs.
Notice of First Office Action from Chinese Patent Application No. 201780002052.4 dated Nov. 30, 2022, 14 pgs.
Preliminary Rejection from Korean Patent Application No. 10-2017-7037830, dated Nov. 9, 2023, 12 pgs.

* cited by examiner

HIGH POWER ELECTROSTATIC CHUCK DESIGN WITH RADIO FREQUENCY COUPLING

CROSS-REFERENCE TO RELATED APPLICATIONS

This application is a Divisional of U.S. patent application Ser. No. 15/383,035, filed Dec. 19, 2016, which claims priority to U.S. Patent Application No. 62/352,667 filed Jun. 21, 2016, the priority of which is hereby claimed to U.S. Patent Application No. 62/346,746 filed Jun. 7, 2016, the entire contents of which are hereby incorporated by reference herein.

FIELD

The present description relates to an electrostatic chuck to carry a workpiece for semiconductor and micromechanical processing and in particular to electrodes in the chuck.

BACKGROUND

In the manufacture of semiconductor chips, a silicon wafer or other substrate is exposed to a variety of different processes in different processing chambers. The chambers may expose the wafer to a number of different chemical and physical processes whereby minute integrated circuits are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates may be silicon, gallium arsenide, indium phosphide, glass, or other appropriate materials.

In these manufacturing processes, plasma may be used for depositing or etching various material layers. Plasma processing offers many advantages over thermal processing. For example, plasma enhanced chemical vapor deposition (PECVD) allows deposition processes to be performed at lower temperatures and at higher deposition rates than in analogous thermal processes. PECVD therefore allows material to be deposited at lower temperatures.

The processing chambers used in these processes typically include a substrate support, pedestal, or chuck disposed therein to support the substrate during processing. In some processes, the pedestal may include an embedded heater adapted to control the temperature of the substrate and/or provide elevated temperatures that may be used in the process.

HAR (High Aspect Ratio) plasma etch uses a significantly higher bias power to achieve bending free profiles. In order to support HAR for dielectric etching, the power may be increased to 20 KW, which brings significant impacts on an ESC (Electrostatic Chuck). Many current ESC designs cannot survive such a high voltage which comes as a direct result of a high bias power. Holes designed into an ESC may suffer in particular. Moreover, an ESC may experience bond failures in the lift pin area when excess radicals erode the bonds. Another impact is that the ESC surface temperature changes at a higher rate. The heating of the ESC surface is directly proportional to the applied RF plasma power. The heat may also be a result of bond failure. In addition bowing of the wafer carried on the ESC and the charge build up on the wafer also makes wafer de-chucking more difficult.

Common processes use an ESC to hold a wafer with 2 MHz 6.5 KW plasma power applied to the wafer for etching applications. High aspect ratio (e.g. 100:1) applications use much higher plasma powers. An ESC is described herein that operates within a low frequency high power plasma voltage to generate a high wafer bias. The higher power will increase failures of the ESC due to the dielectric breaking down and due to plasma ignition in gas holes that are designed into the ESC. The described ESC withstands high power and high bias voltages.

SUMMARY

An electrostatic chuck with an improved electrode is described. In some examples, the chuck includes a base plate, a top plate, a first electrode in the top plate proximate the top surface of the top plate to electrostatically grip a workpiece, and a second electrode in the top plate spaced apart from the first electrode, the first and second electrodes being coupled to a power supply to electrostatically charge the first electrode.

BRIEF DESCRIPTION OF THE DRAWINGS

Embodiments of the present invention are illustrated by way of example, and not limitation, in the figures of the accompanying drawings in which.

DETAILED DESCRIPTION

In some embodiments, two levels of mesh are formed inside or added to a ceramic top plate of an electrostatic chuck (ESC). The design of the lower mesh is modified compared to the upper mesh in order to accommodate higher plasma powers and frequencies during processing when a workpiece, such as a silicon wafer, is held by the chuck. The chuck may be formed in a variety of different ways.

Higher voltages in the plasma may cause electrostatic discharge within the chuck top plate or puck. Using two layers of electrode mesh in the puck, an upper and lower, a discharge free Faraday cage may be formed in the puck.

Figure 1:
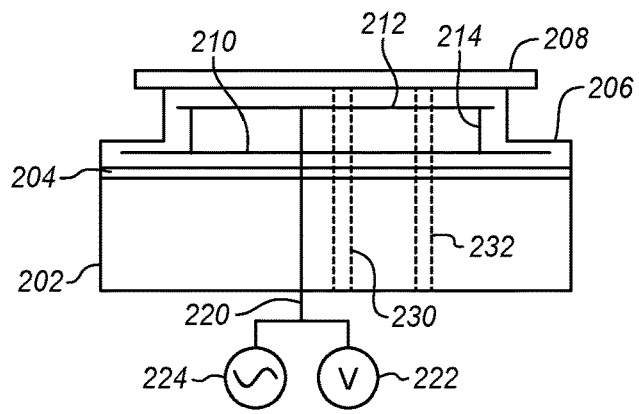
FIG. 1 is a cross-sectional side view diagram of an electrostatic chuck with a dual mesh electrode in accordance with an embodiment of the invention.

FIG. 1 is a cross-sectional side view diagram of an electrostatic chuck with a dual mesh electrode in the top puck. In the illustrated example, the chuck is an ESC with an Al cooling or base plate 202. A puck 206 is bonded to the base plate with a layer of dielectric adhesive 204. The adhesive attenuates electric and thermal conduction between the puck and the base plate. The puck is made of ceramic or another dielectric. The puck holds a workpiece, such as a wafer 208 using an electrostatic force. The workpiece will be referred to herein as a wafer, although the chuck may carry other workpieces for a variety of different products and processes. The diagram is simplified so as not to obscure the features of the invention.

The base plate may contain many other components, features, and external connections for thermal fluid, gas flow, heater power, sensors, and other components. Similarly the puck may include heaters, sensors, liquid and gas flow channels and other features that are connected through the base plate to external components. There may be additional plates below the illustrated base plate for physical support and to carry some of these other components. While there may be many other additional features, there may be a single central tube 230 through the chuck base plate and top plate to carry a cooling and thermal conduction gas such as helium through the chuck from the back side of the wafer. There may be additional gas holes and other holes. Additional holes 232 through the base plate and wafer may provide for lift pins, for example, to push the wafer off the chuck for de-chucking.

The electrostatic force to hold the wafer 208 is generated using an upper electrode 212, such as a mesh of wires or a plate near the top surface of the puck that is charged by applying a voltage from an external power supply 222 to the wire mesh through an electrical connector or rod 220 through the base plate and the puck. The external power supply may be an AC (Alternating Current) or DC (Direct Current) power source. The wire mesh 212 appears as a line near the wafer in this cross-sectional side view. In a top view, the mesh is a web of usually orthogonal crossing wires that covers most of the area near the top surface of the puck. The wires may be copper, aluminum, or molybdenum. Alternatively, the wire mesh may be a solid or mostly solid conducting plate embedded in the puck. The plate may be in several parts to apply different electrostatic polarities or amounts of charge. The top 212 and a bottom mesh 210 may be formed by screen printing, deposition, or spinning. Alternatively, conductive plates may be separately cast or machined and then placed into the top plate as the top plate is formed.

The top wire mesh may also be coupled through the electrical connector 220 to an external RF (Radio Frequency) power generator 224 to induce a bias voltage on the wafer and induce ion bombardment on the wafer. The RF power supply 224 may be the same as or different from the DC voltage source 222. The connector 220 to the top mesh 212 may be the same connector or two or more different connectors leading to the same top mesh.

As mentioned above, the puck has a dual mesh or dual electrodes. A lower mesh 210 is added below the primary upper mesh 212. The lower wire mesh is electrically connected to the voltage supply using a series of pegs 214 connected between the upper mesh and the lower mesh and carries the same voltage potential and RF power. The dual mesh makes the effective thickness of the dielectric thinner from an RF power coupling perspective while maintaining the thermal U % benefits of a thicker dielectric material. U % in this context refers to the amount of uniformity. The dual mesh also reduces or eliminates the e-field gradient between the top and bottom mesh.

By connecting the two meshes 210, 212 using the pegs 214, the dual mesh is able to prevent helium ignition in the puck. Helium ignition is due to the electric-field created by RF power coupling to the single mesh electrode embedded in the ceramic plate. This is the upper electrode that is used to clamp a wafer with electrostatic force. The lower mesh creates a sort of Faraday cage inside the puck between the upper mesh and the lower mesh. All of the channels, holes, and gaps (not shown) in the area between the upper and lower mesh will be shielded from any charge build up. The upper mesh is as close to the top of the puck as possible to provide a better electrostatic grip. The lower mesh is as close to the bottom of the puck as possible to provide a larger Faraday cage.

Figure 2:
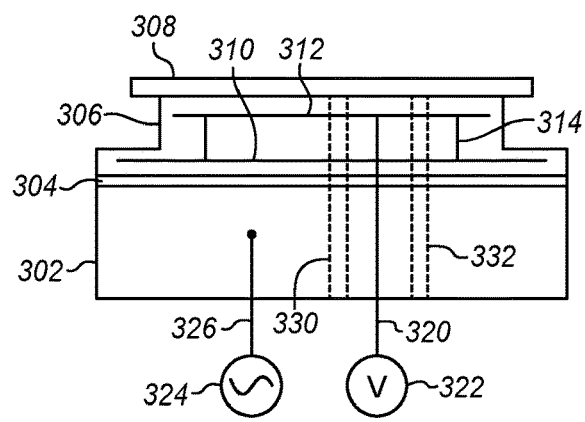
FIG. 2 is a cross-sectional side view diagram of an alternative electrostatic chuck with a dual mesh electrode in accordance with an embodiment of the invention.

FIG. 2 is a cross-sectional side view diagram of an alternative embodiment of the dual mesh shield. As in the example of FIG. 1, a puck 306 or top plate is attached by an isolating adhesive layer 304 to a base plate 302. The base plate is typically aluminum while the top plate is typically ceramic such as alumina, however, other materials may be used. There is a central gas hole 330 and lift pin holes 332, among other features. As in the example of FIG. 1, the puck has an upper mesh 312 and a lower mesh 310 electrically connected together with pegs 314 or any other suitable electrical connector. The meshes and the pegs are embedded in the ceramic as the ceramic is fired, however, they may alternatively be attached or formed in another way. The top mesh provides an electrostatic charge to grip a wafer 308 that is to be processed. As in FIG. 1, the lower wire mesh is electrically connected to the voltage supply and carries the same voltage potential.

In the example of FIG. 2, the two meshes are coupled to a voltage source 322 through an electrical connector in the form of a rod 320 that is conveyed through a channel in the base plate 302. An RF power supply 324 is coupled to the base plate 302 using an electrical connector 326. The RF power generator induces a bias voltage on the wafer and induces ion bombardment on the wafer.

The dual mesh functions as in the previous example to prevent ignition of any gases or other material in the puck between the two mesh layers by shielding this part of the puck from any charge build up. In addition, the dual mesh 310, 312 enhances RF power 324 conduction through the puck 306 from the cooling plate to the wafer 308. The conductive mesh 310, 312 and the base plate 302 act, in part, as capacitor plates separated by the dielectric adhesive layer 304 and the ceramic material of the puck 306. This capacitance is reduced by the lower mesh 310 and by placing the lower mesh close to the base plate. The capacitance is also reduced by applying a DC voltage to the base plate that is similar to the DC voltage applied to the puck electrostatic electrodes 310, 312. Such a DC potential may be applied to the base plate in any of the described examples herein.

The dual mesh structure drastically reduces the capacitance and the impedance through the puck between the cooling plate and the wafer. In effect, the dual mesh reduces the dielectric thickness of the puck for purposes of RF power coupling through the puck. At the same time the thermal U % benefit is maintained. This can result in a 10% or higher increase in the etch rate on a real wafer in a plasma etch chamber.

Figure 3:
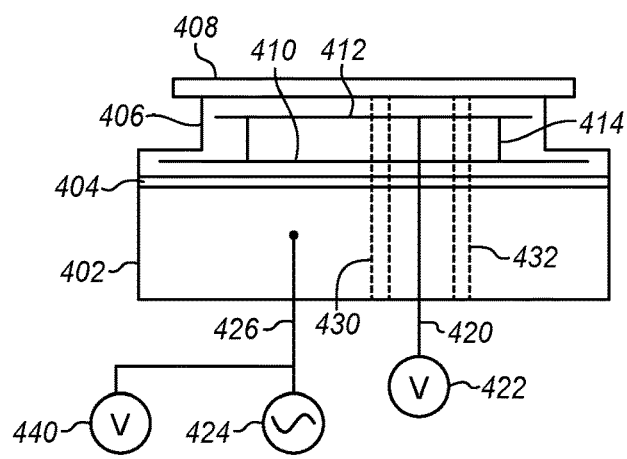
FIG. 3 is a cross-sectional side view diagram of a further alternative electrostatic chuck with a dual mesh electrode in accordance with an embodiment of the invention.

FIG. 3 is a cross-sectional side view diagram of an alternative embodiment of the dual mesh shield in which a negative voltage is applied to the cooling plate to reduce the potential difference between the workpiece and the cooling plate. As in the example of FIG. 1, a ceramic puck 406 is attached to an aluminum base plate 402 with a layer of adhesive 404. The puck has an embedded upper mesh 412 and lower mesh 410 electrically connected together with pegs 414. As in FIG. 1, the lower wire mesh is electrically connected to the voltage supply and carries the same voltage potential. The assembly has a central gas hole 430 and lift pin holes 432, among other features.

In the example of FIG. 3, the two meshes are coupled to a voltage source 422 through a rod 420 through the base plate 402. An RF power supply (not shown) may also be coupled to the puck to induce a bias voltage on the wafer. A second RF power supply 424 is also coupled to the base plate 402 using an electrical connector 426. In addition a DC voltage 440 is coupled to the base plate. The DC 440 and RF 424 power supplies may be the same or separate as shown.

The DC potential on the base plate reduces the potential difference between the base plate and the wafer. Power applied to the DC electrode does not generate a DC discharge because the electrode is embedded in ceramic. This prevents a secondary electron emission from the electrode to sustain the DC discharge On the other hand there is a potential difference between the wafer and the cooling plate. The potential on the wafer has been generated by the RF power that is applied either to the electrode in FIG. 1 or the base plate in FIG. 2.

As an example, with a chucking voltage of −4 kV on the electrostatic electrodes, there will be a potential difference of 4 kV or more. The difference may be more if the voltage of the base plate is allowed to float. On the other hand, by applying a voltage of about −2 kV to the base plate, the potential difference may be reduced by half to about 2 kV. The reduced capacitance provides more control over the plasma process parameters and further reduces arcing within the base plate and gas holes in the puck. Higher voltages may be applied to the base plate up to and including the voltage of the wafer, in this case −4 kV, but it may be another voltage. This reduces the electric field through the puck.

Figure 4:
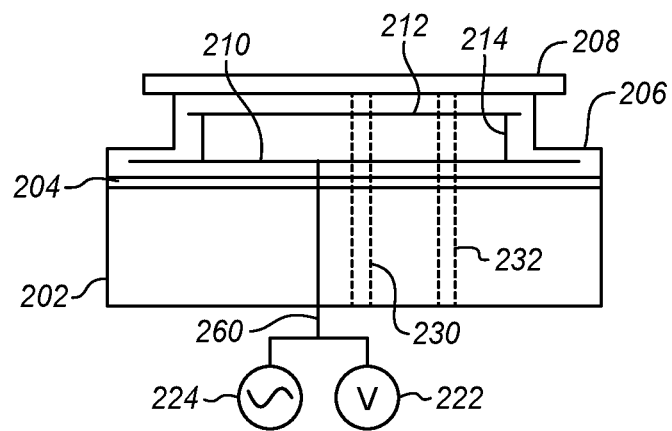
FIG. 4 is a cross-sectional side view diagram of a further alternative electrostatic chuck with a dual mesh electrode in accordance with an embodiment of the invention.

FIG. 4 is a cross-sectional side view diagram of a variation of the chuck of FIG. 1 with a dual mesh. In this example, the chuck is also an ESC with a cooling plate 202. A puck 206 is bonded to the base plate with a layer of dielectric adhesive 204. The puck holds a workpiece 208 using an electrostatic force. A single central tube 230 through the chuck base plate and top plate carry a cooling and thermal conduction gas such as helium, nitrogen, or some other gas through the chuck from the back side of the wafer. Additional holes 232 through the base plate and wafer carry gas, or contain lift pins to push the wafer off the chuck for de-chucking.

The electrostatic force to hold the wafer 208 is generated using an upper electrode 212, that is charged by applying a voltage from an external power supply 222 through an electrical connector or rod 260 through the base plate and the puck to a lower electrode 210. The bottom electrode 212 may also be coupled to an external RF (Radio Frequency) power generator 224. As shown the connector rod 260 is connected directly the lower electrode 210 instead of the upper electrode 212 as in FIG. 1.

The lower electrode 210 is electrically connected to the top electrode 212 using a series of pegs 214 connected between the upper and the lower electrode so that the upper electrode carries the same voltage potential and RF power as the lower electrode. As in the example of FIG. 1, the connected electrodes 210, 212 using the pegs 214, are able to prevent helium ignition and other static discharge effects in the puck in the manner of a large Faraday cage.

Figure 5:
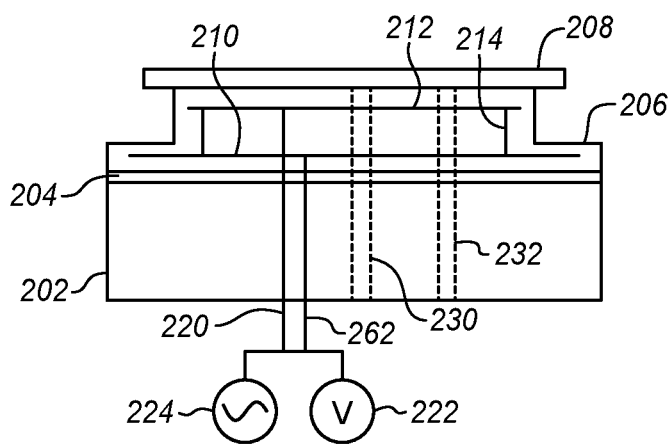
FIG. 5 is a cross-sectional side view diagram of a further alternative electrostatic chuck with a dual mesh electrode in accordance with an embodiment of the invention.

FIG. 5 is a cross-sectional side view diagram of a variation of the chuck of FIG. 1 with a dual mesh. The ESC has a cooling plate 202 and an attached puck 206 with a layer of dielectric adhesive 204. The puck holds a workpiece 208 and various tube or holes 230, 232 through the chuck base plate 202 and top plate 206 provide access through the puck to the back side of the wafer.

In this example there is a first connector or rod 220 to an upper electrode 212 in the puck and a second connector or rod 262 to a lower electrode in the puck. These rods both apply a voltage from the same external power supply 222 and optional external RF (Radio Frequency) power generator 224. The two rods directly connect both electrodes to the same power supply, however, different power supplies may optionally be used.

In addition, the lower electrode 210 is optionally electrically connected to the top electrode 212 using a series of pegs 214 connected between the upper and the lower electrode. As in the example of FIG. 1, the connected electrodes 210, 212 form a large Faraday cage. While the examples of FIGS. 4 and 5 use the power connection to the electrodes of FIG. 1, the connections of FIG. 2 may alternatively, be used.

Figure 6:
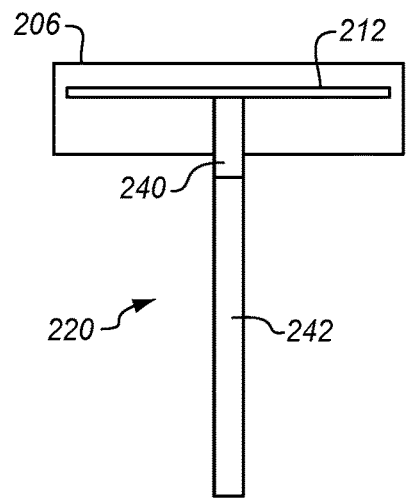
FIG. 6 is a cross-sectional side view diagram of an example of the electrical connector of FIG. 1 in accordance with an embodiment of the invention.

FIG. 6 is a cross-sectional side view diagram of an example of the electrical connector 220 that connects the top electrode 212 to the power supply. The rod extends through an opening in the lower electrode (not shown). The rod has an upper portion 240 in contact with the electrode made from a highly resistive material and a longer lower portion 242 made of a low resistive material such as aluminum or copper. The upper portion may be made of any of a variety of materials such as aluminum mixed or doped with alumina powder. The concentration of the particles of alumina powder determines the resistivity of the rod. The high resistivity material may have a resistance of 1 kilo Ohm or more and the low resistivity portion may have a resistance of less than 1 kilo Ohm.

The highly resistive portion of the rod serves to limit current flow and in particular large current surges through the rod. In use, the upper and lower electrodes may have high charges induced by plasma power in the chamber. By restricting current flow, the current is restricted from flow through the rod to the power supply. This protects the power supply. In addition charge on the electrodes is induced to stay more on the electrode instead of flowing through the rod and creating a hot spot where the rod connects to the electrode. With enough current the rod may overheat, heating the puck and perhaps destroying the puck. With an alumina ceramic puck, too much heat will cause the ceramic of the puck to crack.

Figure 7:
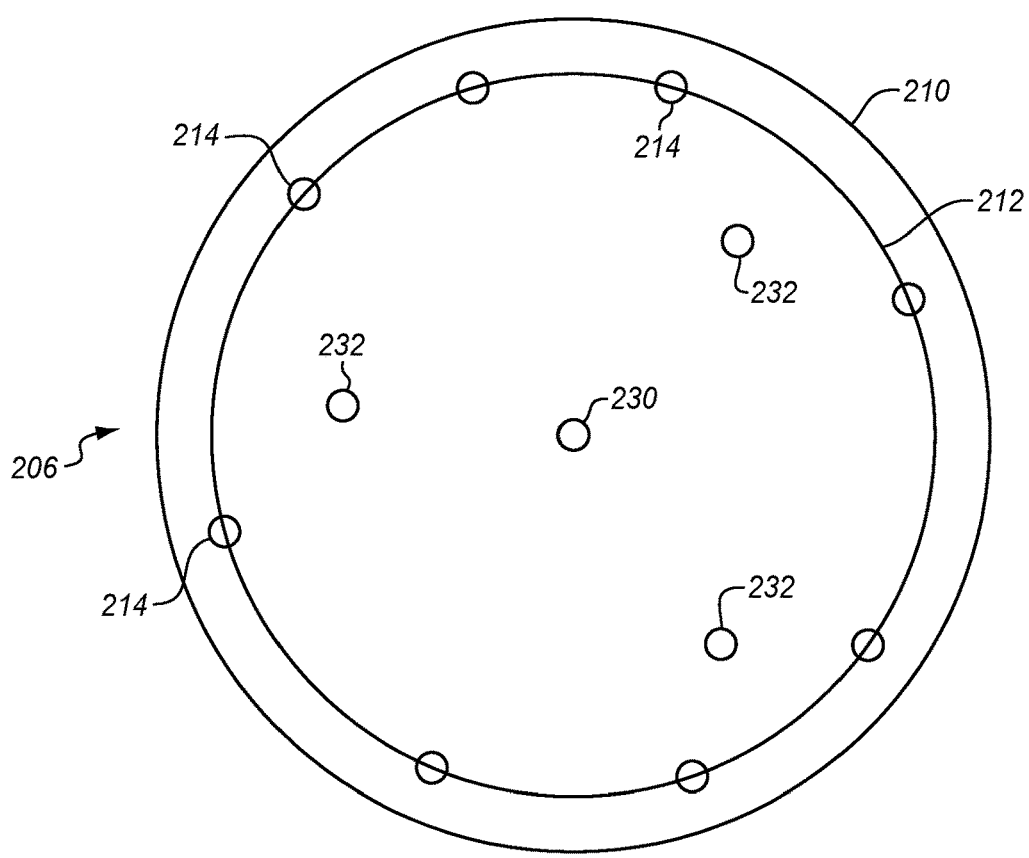
FIG. 7 is a partially transparent top view diagram of the puck of FIG. 1 showing various holes in accordance with an embodiment of the invention.

FIG. 7 is a top view diagram of the puck 206 of FIG. 1 in a partially transparent view. The puck has the lower electrode 210 which is sized to be a little larger than the wafer that it will hold and the upper electrode 212 which is sized to be almost the same size as the wafer that it will hold. The electrodes are within the dielectric material of the chuck that is shown as transparent to make the electrodes visible. The upper 212 and lower 210 electrodes may be in the form of a grid of small wires, a coating, or a solid plate and will be referred to here with any of these terms.

The electrodes are electrically connected with a series of connector pegs 214. These pegs are shown as being around the periphery of the upper electrode and connecting just inside the lower electrode. The pegs may be embedded and formed in the puck or they may be formed of a solid or hollow conductive material and then held in place as the puck material is cured. The pegs may be evenly or unevenly spaced around the periphery of the upper electrode. The pegs are close enough together to from a Faraday cage against the expected RF energy that is expected for plasma processes in a processing chamber. In addition to the electrodes, there is the central gas hole 230 and the lift pin holes 232. There may be additional holes and other structures to perform other functions. As in FIG. 1, heaters, cooling channels, plasma process structures and other components are not shown in order not to obscure the drawing figure.

As shown, the holes 230, 232 are within the perimeter of the upper and lower electrodes. This has the result that the holes are largely within the Faraday cage as described above and protected from external voltage, charge and other conditions caused by a high energy plasma.

In this description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Figure 8:
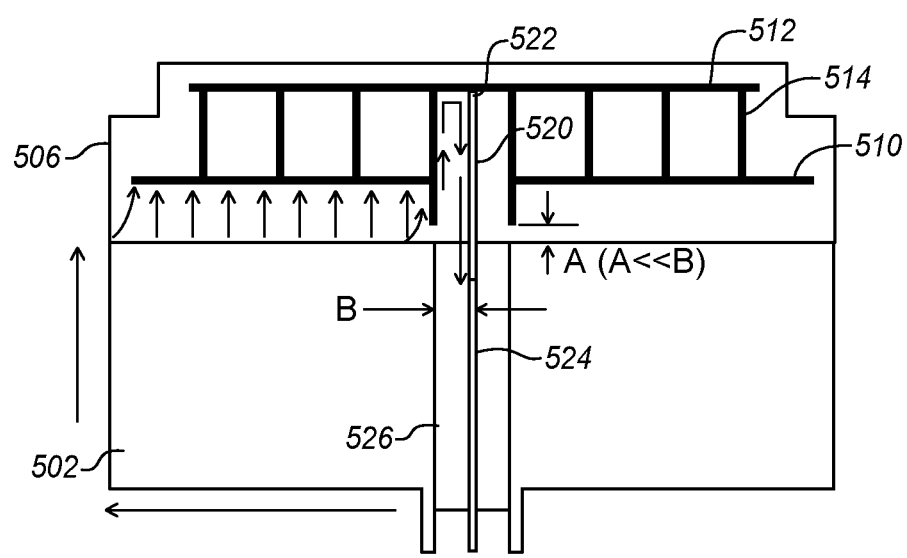
FIG. 8 is a cross-sectional side view diagram of an electrostatic chuck with an enhanced rod in accordance with an embodiment of the invention.

FIG. 8 is a cross-sectional side view diagram of an electrostatic chuck with an enhanced rod to provide the chucking current to the electrode. The described conductive rod may be adapted to any of the other chuck examples. As in the other diagrams a base plate 502 supports a top plate 506 which electrostatically grips a workpiece, such as a silicon wafer, using charge on an upper electrode 512. A rod 520 conducts current through the base plate to the electrode 512 to establish and dissipate the electric charge. A lower electrode 510 is coupled to the upper electrode through an array of vertical pegs 514. As mentioned above, due to the pegs, the rod may connect to either the upper electrode, the lower electrode, or both. The electrodes and pegs are embedded into the top plate which is typically, but not necessarily, ceramic.

The base plate is thermally conductive and may have coolant channels, heaters, and other thermal control elements. Common thermally conductive materials are also electrically conductive and aluminum is a common material for the base plate. The top plate on the contrary is dielectric to allow it to maintain the electrostatic charge and so typically also has very low thermal conductivity. This is compensated for by making the top plate very thin.

Due to these electrical characteristics, when the chuck is placed in an RF plasma, RF current tends to flow across the surface of the conductive base plate and through the top plate to the upper and the lower electrode. This is shown as arrows originating on the surface of the base plate and traveling through the top plate to the lower electrode. Since the electrodes are electrically connected, the RF current flow freely through both electrodes. The RF current tends to concentrate at the point 522 at which the mesh connects to the rod. The amount of accumulation depends on the impedance of the plasma and the impedance of the rod. The rod is conductive and conducts current to a connected power supply so the RF current tends to flow down the rod toward the power supply as shown by the arrows. When the rod is also supplying an RF current to the electrodes, then the concentration of RF current is increased. The high RF current concentration can cause arcing within the top plate or between the top plate and the workpiece.

The enhanced rod 520 as shown includes an inductor 524 around or coupled to the portion that travels through the cooling plate 502. As with the other examples herein, the inductor and rod are electrically insulated from the conductive base plate by an electrical insulator 526 within the hole through which the rod extends.

The inductor 524 may take any of a variety of different forms, such as a wire coil, cylinder, or bead. The inductance may be selected based on the anticipated frequency of the RF plasma. The inductor provides a choke or block to RF current generated by the applied RF plasma. This effect is shown by the arrows stopping at the inductor 524. The choke effect prevents the concentration of RF current at the connection point of the rod and the electrodes. If an RF current is applied to the electrodes from a power supply as in FIGS. 4 and 5, then the inductance is also selected to allow the supplied power to reach the electrode while also blocking RF current generated by the plasma.

If RF power is also applied to the chucking electrode 512, then it is very hard to select an inductance which blocks the RF current generated by the plasma from flowing into the rod and at the same time allows the RF power applied to the electrode to flow through the electrode to the wafer. This is because the frequencies of the plasma and the applied RF power tend to be similar. The inductor on the rod will also create an impedance that is directly related to the frequency that is attempting to pass through the inductor. For a coil inductor the impedance is defined by $2\pi \times \text{frequency} \times \text{Inductance}$.

Figure 9:
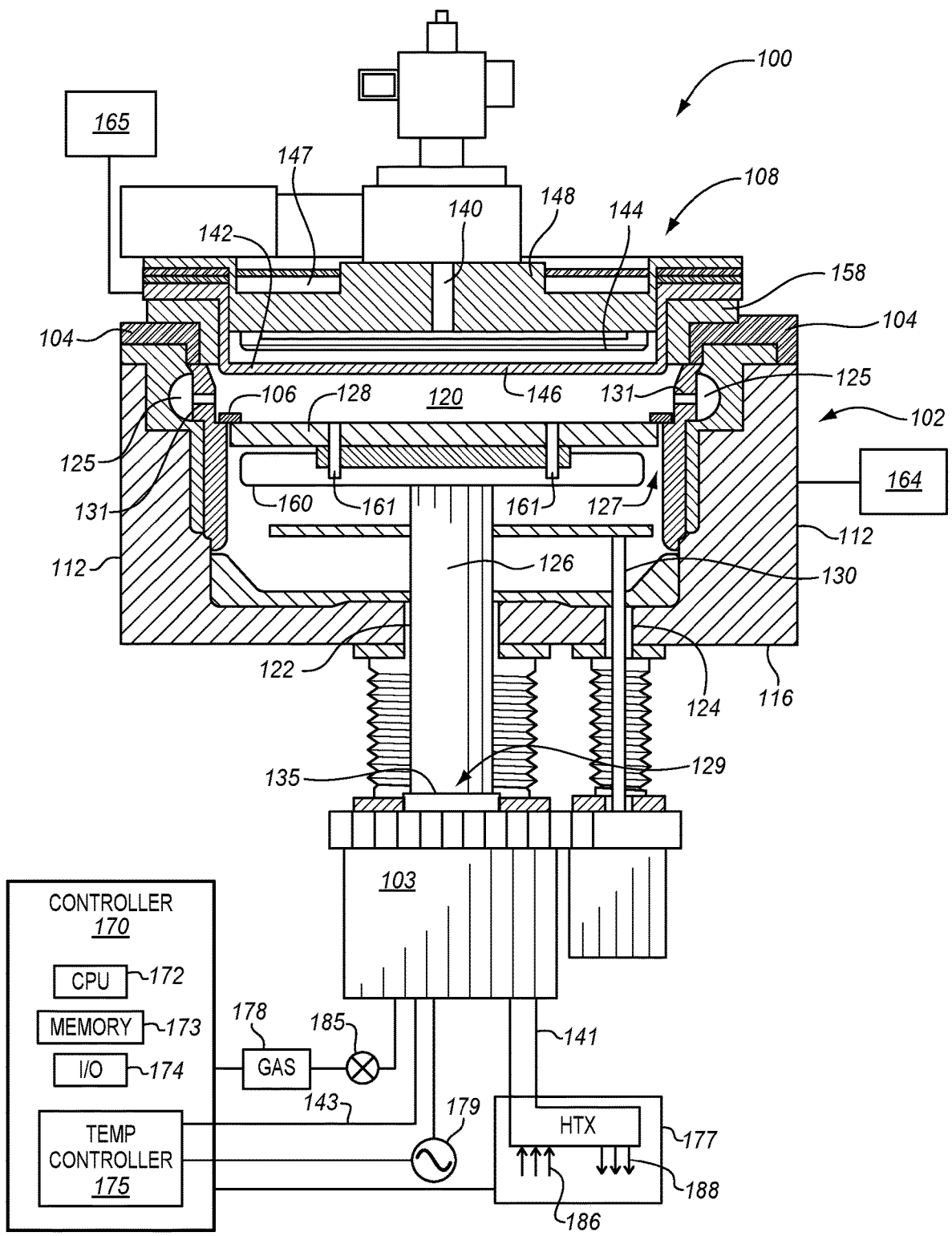
FIG. 9 is a diagram of a plasma etch system including a workpiece carrier in accordance with an embodiment of the present invention.

FIG. 9 is a partial cross sectional view of a plasma system 100 having a pedestal or chuck 128 according to embodiments described herein. The pedestal 128 has an active cooling system which allows for active control of the temperature of a substrate positioned on the pedestal over a wide temperature range while the substrate is subjected to numerous process and chamber conditions. The plasma system 100 includes a processing chamber body 102 having sidewalls 112 and a bottom wall 116 defining a processing region 120.

A pedestal, carrier, chuck or ESC 128 is disposed in the processing region 120 through a passage 122 formed in the bottom wall 116 in the system 100. The pedestal 128 is adapted to support a substrate (not shown) on its upper surface. The substrate may be any of a variety of different workpieces for the processing applied by the chamber 100 made of any of a variety of different materials. The pedestal 128 may optionally include heating elements (not shown), for example resistive elements, to heat and control the substrate temperature at a desired process temperature. Alternatively, the pedestal 128 may be heated by a remote heating element, such as a lamp assembly.

The chuck also includes upper and lower connected electrodes (not shown) embedded within the chuck to hold a wafer (not shown) to the top surface of the chuck. The chuck includes a top plate and a base plate as shown in more detail in FIG. 1.

The pedestal 128 is coupled by a shaft 126 to a power outlet or power box 103, which may include a drive system that controls the elevation and movement of the pedestal 128 within the processing region 120. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is used to activate substrate lift pins 161 disposed through the pedestal 128. The substrate lift pins 161 lift the workpiece off the pedestal top surface to allow the workpiece to be removed and taken in and out of the chamber, typically using a robot (not shown) through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146.

A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120 in very close proximity to the sidewalls 101, 112 of the chamber body 102 to prevent exposure of the sidewalls 101, 112 to the processing environment within the processing region 120. The liner assembly 127 includes a circumferential pumping cavity 125 that is coupled to a pumping system 164 configured to exhaust gases and byproducts from the processing region 120 and control the pressure within the processing region 120. A plurality of exhaust ports 131 may be formed on the chamber liner assembly 127. The exhaust ports 131 are configured to allow the flow of gases from the processing region 120 to the circumferential pumping cavity 125 in a manner that promotes processing within the system 100.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller receives a temperature reading 143 from a sensor (not shown) on the pedestal. The temperature sensor may be proximate a coolant channel, proximate the wafer, or placed in the dielectric material of the pedestal. The temperature controller 175 uses the sensed temperature or temperatures to output control signals affecting the rate of heat transfer between the pedestal assembly 142 and a heat source and/or heat sink external to the plasma chamber 105, such as a heat exchanger 177.

The system may also include a controlled heat transfer fluid loop 141 with flow controlled based on the temperature feedback loop. In the example embodiment, the temperature controller 175 is coupled to a heat exchanger (HTX)/chiller 177. Heat transfer fluid flows through a valve (not shown) at a rate controlled by the valve through the heat transfer fluid loop 141. The valve may be incorporate into the heat exchanger or into a pump inside or outside of the heat exchanger to control the flow rate of the thermal fluid. The heat transfer fluid flows through conduits in the pedestal assembly 142 and then returns to the HTX 177. The temperature of the heat transfer fluid is increased or decreased by the HTX and then the fluid is returned through the loop back to the pedestal assembly.

The HTX includes a heater 186 to heat the heat transfer fluid and thereby heat the substrate. The heater may be formed using resistive coils around a pipe within the heat exchanger or with a heat exchanger in which a heated fluid conducts heat through an exchanger to a conduit containing the thermal fluid. The HTX also includes a cooler 188 which draws heat from the thermal fluid. This may be done using a radiator to dump heat into the ambient air or into a coolant fluid or in any of a variety of other ways. The heater and the cooler may be combined so that a temperature controlled fluid is first heated or cooled and then the heat of the control fluid is exchanged with that of the thermal fluid in the heat transfer fluid loop.

The valve (or other flow control devices) between the HTX 177 and fluid conduits in the pedestal assembly 142 may be controlled by the temperature controller 175 to control a rate of flow of the heat transfer fluid to the fluid loop. The temperature controller 175, the temperature sensor, and the valve may be combined in order to simplify construction and operation. In embodiments, the heat exchanger senses the temperature of the heat transfer fluid after it returns from the fluid conduit and either heats or cools the heat transfer fluid based on the temperature of the fluid and the desired temperature for the operational state of the chamber 102.

Electric heaters (not shown) may also be used in the pedestal assembly to apply heat to the pedestal assembly. The electric heaters, typically in the form of resistive elements are coupled to a power supply 179 that is controlled by the temperature control system 175 to energize the heater elements to obtain a desired temperature.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluid such as those containing perfluorinated inert polyethers. While the present description describes the pedestal in the context of a PECVD processing chamber, the pedestal described herein may be used in a variety of different chambers and for a variety of different processes.

A backside gas source 178 such as a pressurized gas supply or a pump and gas reservoir are coupled to the chuck assembly 142 through a mass flow meter 185 or other type of valve. The backside gas may be helium, argon, or any gas that provides heat convection between the wafer and the puck without affecting the processes of the chamber. The gas source pumps gas through a gas outlet of the pedestal assembly described in more detail below to the back side of the wafer under the control of the system controller 170 to which the system is connected.

The processing system 100 may also include other systems, not specifically shown in FIG. 7, such as plasma sources, vacuum pump systems, access doors, micromachining, laser systems, and automated handling systems, inter alia. The illustrated chamber is provided as an example and any of a variety of other chambers may be used with the present invention, depending on the nature of the workpiece and desired processes. The described pedestal and thermal fluid control system may be adapted for use with different physical chambers and processes.

As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

Examples of different embodiments of the dual electrode system include an ESC with a dual DC electrode in the top plate in which the two electrodes are spaced apart and connected to a power supply.

Embodiments include the design above in which the electrostatic force of the ESC is generated by an upper electrode of the two electrodes near the top surface of the puck that is charged by applying a voltage to the upper electrode.

Embodiments include the design above in which the electrodes are each formed by a mesh of wires.

Embodiments include the design above in which the mesh is a web of usually orthogonal crossing wires.

Embodiments include the design above including an Al base plate that is connected to an RF generator.

Embodiments include the design above in which the lower electrode is electrically connected to the voltage supply through a series of pegs attached between the upper electrode and the lower electrode and carries the same voltage potential.

Embodiments include the design above in which there are channel, holes, and/or gaps in the area between the upper and lower electrodes.

Embodiments include the design above in which any channel, holes, and gaps in the area between the upper and lower electrodes are shielded from any charge build up by the upper and lower mesh.

Embodiments include the design above in which the electrodes are connected to the power supply by an electrically conducing rod.

Embodiments include the design above in which the rod has a high resistivity section, with for example a resistance more than 1 KOhm, closest to the electrodes and a low resistivity section, with for example a resistance less than 1 KOhm, closest to the power supply.

Embodiments include the design above in which the high resistivity portion is formed of aluminum mixed with alumina particles.

Embodiments include means for performing the functions of any of the above embodiments.

Embodiments include a method for processing a workpiece in a plasma processing chamber that include driving an electrode in a top plate of an electrostatic chuck at a first voltage to grip the workpiece, the first electrode being near the top surface of the top plate and driving a second electrode in the top plate at the first voltage to form Faraday cage within the top plate.

Embodiments include the design above in which the electrodes are also driven at a radio frequency to bias the plasma in the chamber.

What is claimed is:

1. A method of processing a workpiece in a plasma processing chamber, the method comprising:
   driving a first electrode in a top plate of an electrostatic chuck at a first voltage to grip the workpiece, the first electrode being near a top surface of the top plate; and
   driving a second electrode in the top plate at the first voltage to form a Faraday cage together with the first electrode within the top plate, wherein the electrostatic chuck comprises a base plate, the top plate, the first electrode in the top plate proximate the top surface of the top plate, the first electrode having a width, and the first electrode comprising a first web of a plurality of usually orthogonal crossing wires extending across the width of the first electrode, the second electrode in the top plate and spaced apart from the first electrode and below the first electrode, the second electrode having a width greater than the width of the first electrode, and the second electrode comprising a second web of a plurality of usually orthogonal crossing wires extending across the width of the second electrode, wherein the width of the second electrode is greater than a width of the workpiece, a plurality of conductive pegs electrically connecting the first electrode to the second electrode, wherein the first electrode, the second electrode and the plurality of conductive pegs form the Faraday cage, and a plurality of lift pin holes extending through the Faraday cage, each of the plurality of lift pin holes off-set from a center of the Faraday cage.

2. The method of claim 1, further comprising driving the first and second electrodes at a radio frequency to bias the workpiece in the chamber.

3. The method of claim 1, wherein the base plate is attached to the top plate with a dielectric adhesive.

4. The method of claim 1, wherein the first and the second electrodes are formed of a conductive mesh.

5. The method of claim 1, wherein the top plate is ceramic and the electrodes and pegs are embedded in the ceramic.

6. The method of claim 1, wherein the base plate includes cooling channels to carry a coolant to cool the workpiece, when present.

7. The method of claim 1, wherein any channel, holes, or gaps in an area between the first and second electrodes are shielded from charge build up by the first and second electrodes.

8. A method of fabricating an electrostatic chuck, the method comprising:
   forming a base plate;
   forming a top plate;
   forming a first electrode in the top plate proximate the top surface of the top plate to electrostatically grip a workpiece, when present, the first electrode having a width, and the first electrode comprising a first web of a plurality of usually orthogonal crossing wires extending across the width of the first electrode;
   forming a second electrode in the top plate spaced apart from the first electrode and below the first electrode, the second electrode having a width greater than the width of the first electrode, and the second electrode comprising a second web of a plurality of usually orthogonal crossing wires extending across the width of the second electrode, wherein the width of the second electrode is greater than a width of the workpiece, when present, and the first and second electrodes for coupling to a power supply to electrostatically charge the first electrode;
   forming a plurality of conductive pegs electrically connecting the first electrode to the second electrode, wherein the first electrode, the second electrode and the plurality of conductive pegs form a Faraday cage; and
   forming a plurality of lift pin holes extending through the Faraday cage, each of the plurality of lift pin holes off-set from a center of the Faraday case.

9. The method of claim 8, further comprising attaching the base plate to the top plate with a dielectric adhesive.

10. The method of claim 8, further comprising forming the first and the second electrodes from a conductive mesh.

11. The method of claim 8, wherein the top plate is ceramic, the method further comprising embedding the electrodes and pegs in the ceramic.

12. The method of claim 8, further comprising coupling a rod to the second electrode.

13. The method of claim 8, further comprising forming cooling channels in the base plate, the cooling channels to carry a coolant to cool the workpiece, when present.

14. The method of claim 8, wherein any channel, holes, or gaps in an area between the first and second electrodes are shielded from charge build up by the first and second electrodes.

\* \* \* \* \*